(12) United States Patent
Shinzou et al.

(10) Patent No.: US 6,648,662 B2
(45) Date of Patent: Nov. 18, 2003

(54) CONTINUITY TEST UNIT FOR CONNECTOR

(75) Inventors: Tomohiro Shinzou, Yokkaichi (JP); Eiji Fudoo, Yokkaichi (JP)

(73) Assignee: Sumitomo Wiring Systems, Ltd., Yokkaichi (JP)

(*) Notice: Subject to any disclaimer, the term of this patent is extended or adjusted under 35 U.S.C. 154(b) by 0 days.

(21) Appl. No.: 10/361,758

(22) Filed: Feb. 11, 2003

(65) Prior Publication Data

US 2003/0162430 A1 Aug. 28, 2003

(30) Foreign Application Priority Data

Feb. 28, 2002 (JP) ........................................ 2002-054328

(51) Int. Cl.⁷ ............................................... H01R 13/62
(52) U.S. Cl. ...................................... 439/310; 439/289
(58) Field of Search ................................ 439/289, 310, 439/219, 700, 824, 488

(56) References Cited

U.S. PATENT DOCUMENTS 5,467,023 A * 11/1995 Takeyama .................... 324/754
5,490,798 A * 2/1996 Murakami et al. ........... 439/310
5,586,900 A * 12/1996 Yagi et al. ................... 439/310
5,697,801 A * 12/1997 Tsuji et al. ................... 439/310

FOREIGN PATENT DOCUMENTS

JP 7-65923 3/1995

* cited by examiner

*Primary Examiner*—Tho D. Ta
(74) *Attorney, Agent, or Firm*—Greenblum & Bernstein, P.L.C.

(57) ABSTRACT

A connector is mounted in a connector holder. A test section is moved toward the connector holder by turning a driving mechanism. When probes of the test section come into contact with terminals secured in a housing of the connector mounted in the connector holder, the connector is tested for continuity. If an overload force is applied to the probes during a continuity test, predetermined load breakaway members supporting rear ends of the probes are broken and the probes are moved backward away from the terminals, thereby preventing damage to the terminals or the probes. It is possible to carry out the continuity test again by exchanging the broken breakaway members with new ones.

20 Claims, 10 Drawing Sheets

CONTINUITY TEST UNIT FOR CONNECTOR

BACKGROUND OF THE INVENTION

1. Field of the Invention

The present invention relates to a continuity test unit for a connector and more particularly relates to a continuity test unit for protecting a connector and a detector during testing when an overload force is applied to the detector.

2. Description of the Related Art

A conventional continuity inspection apparatus includes a connector holder for mounting a connector that has a housing containing plural terminals, a test section configured to move forward toward and backward away from the connector holder for testing a continuity of the terminals, and a driving mechanism for moving the test section relative to the connector holder between a test position where the test section approaches the connector holder and a rest position where the test section is displaced away from the connector holder.

The test section has a detector at a position corresponding to the terminals contained in the housing. The detector has an outer sleeve and a contact end portion extending from, and elastically movable relative to, the outer sleeve.

During a continuity test, a connector is mounted in the connector holder and the driving mechanism is actuated to move the test section toward the connector holder. The detector comes into contact with the terminals to commence the continuity test. In order to precisely position the contact end portion relative to the terminal, the outer sleeve is rigidly secured to the test section.

However, if the detector is in an abnormal condition in which the contact end portion cannot elastically retract into the outer sleeve, which is rigidly secured to the test section, the detector will push against the terminal, thereby damaging the terminal and/or the detector. Also, since the outer sleeve is rigidly secured to the test section, it is difficult to reuse the test section from one inspection apparatus in another inspection apparatus.

SUMMARY OF THE INVENTION

In view of the above problems, an object of the present invention is to provide a continuity test unit that can prevent a detector from breaking a connector being tested, and to reduce costs by allowing for the reuse of a test section.

To achieve the foregoing object, according to the present invention, a continuity test unit for a wire harness connector having a housing containing plural terminals is provided. The continuity test unit includes a connector holder, a test section, and a displacement device. The connector holder is configured to hold a connector in position for testing the continuity of plural terminals contained in a housing of the connector. The test section is configured to move forward toward and backward away from the connector holder. The test section includes a detector opposed to the terminals contained in the housing of the connector held in the connector holder, and a block for supporting the detector. The displacement mechanism is configured to move the test section relative to the connector holder between a test position in which the detector contacts the terminals and a release position in which the detector is spaced away from the terminals, permitting loading and unloading of the connector from the connector holder.

The detector includes an outer sleeve mounted to the block and a contact end portion contained in and extending from the outer sleeve for contacting the terminals. The contact end portion is movable relative to the outer sleeve forward toward the connector holder and backward away from the connector holder. The test section includes a connecting member provided between the outer sleeve of the detector and the block. The connecting member interconnects the detector and the block in such a manner that the detector is disconnected from the block when the detector is subjected to a predetermined load.

Further, in the continuity test unit according to the present invention, the block includes a constraining portion for constraining the outer sleeve of the detector from moving relative to the block toward the connector holder.

Further, in the continuity test unit according to the present invention, the connecting member is removably assembled in the block of the test section.

Further, in the continuity test unit according to the present invention, the detector may be subjected to the predetermined load as a result of an abnormal condition of the detector in which the contact end portion is prevented from moving relative to the outer sleeve. Further, the detector may be subjected to the predetermined load as a result of an abnormal positioning of the terminals contained in the housing of the connector held in the connection holder.

Further, in the continuity test unit according to the present invention, the outer sleeve moves relative to the block away from the connector holder when the detector is subjected to the predetermined load. Further, the test section may include a plurality of the connecting members.

Further, in the continuity test unit according to the present invention, the connecting member is a breakaway element which ruptures upon being subjected to the predetermined load by the detector. The outer sleeve moves relative to the block away from the connector holder when the breakaway element is subjected to the predetermined load and ruptures. The breakaway element may include an opening surrounded by a shoulder portion that is thinner than a remaining portion of the breakaway element, such that the shoulder portion ruptures upon being subjected to the predetermined load by the detector. The test section may include a plurality of the breakaway elements. The plurality of breakaway elements may be formed as a plurality of openings in a substantially flat sheet member having a thickness such that the sheet member ruptures upon being subjected to the predetermined load by the detector. The breakaway element constrains the outer sleeve from moving relative to the block away from the connector holder.

Further, in the continuity test unit according to the present invention, the detector includes a latch sheath portion having a larger diameter than the outer sleeve, and the breakaway element is configured to contact and constrain movement of the latch sheath portion. The block includes a first portion and a second portion defining a substantially enclosed space therebetween, and the breakaway element and the latch sheath portion are located within the substantially enclosed space. The latch sheath portion contacts and is held in the substantially enclosed space by the first portion of the block. The breakaway element contacts and is held in said substantially enclosed space by the second portion of the block.

According to another aspect of the present invention, a continuity test unit for a connector having a housing containing plural terminals is provided. The continuity test unit includes a connector holder, a test section, and a displacement device. The connector holder is configured to hold a connector in position for testing the continuity of plural terminals contained in a housing of the connector. The test section is configured to move forward toward and backward away from the connector holder. The test section includes a detector opposed to the terminals contained in the housing of the connector held in the connector holder, and a block for supporting the detector. The displacement device is configured to move the test section relative to the connector holder between a test position in which the detector contacts the terminals and a release position in which the detector is spaced away from the terminals, permitting loading and unloading of the connector from the connector holder.

The test section includes a breakaway element interconnecting the detector and the block for preventing the detector from moving relative to the block away from the connector holder. The breakaway element interconnects the detector and the block in such a manner that the breakaway element ruptures and the detector is disconnected from the block when the detector is subjected to a predetermined load. The breakaway element may include an opening surrounded by a shoulder portion which is thinner than a remaining portion of the breakaway element, such that the shoulder portion ruptures when the detector is subjected to the predetermined load. The test section may include a plurality of the breakaway elements formed as a plurality of openings in a substantially flat sheet member having a thickness such that the sheet member ruptures when the detector is subjected to the predetermined load.

According to the present invention, a continuity test is carried out by mounting the connector in the connector holder and moving the test section toward the connector holder by the driving device in order to bring the contact end portion of the detector into contact with the terminal in the housing. If an overload force is applied to the detector for any reason, it is possible for the connecting member to absorb the overload force applied to the detector and to protect the detector by releasing the detector from the block. Since the continuity test can be carried out by connecting the outer sleeve of the detector to the block of the test section again, it is possible to reuse the test section, thereby reducing costs. The "predetermined load" at which the detector is released from the block may be set at substantially one-half of the limit strength of a usual terminal. For example, if the limit strength of the terminal is 98N, the predetermined load may be set to be 49N.

If any impact force is applied to the detector which would cause rebound or bounce back of the detector toward the connector holder, the detector is restrained from bursting out from the predetermined mounting position by the constraining portion of the block. Thus, by preventing the detector from bursting out towards the connector holder, it is possible to protect the terminal, since the detector can come into contact with the terminal at a more suitable position.

According to this invention, since the connecting member is removably assembled in the block, it is possible to carry out the continuity test again by exchanging the connecting member for a new one when any damage occurs to the connecting member. Accordingly, it is possible to protect the terminal and detector at a reduced cost, since the test section can be reused.

BRIEF DESCRIPTION OF THE DRAWINGS

The above, and other objects, features and advantages of the present invention will be made apparent from the following description of the preferred embodiments, given as nonlimiting examples, with reference to the accompanying drawings in which.

DETAILED DESCRIPTION OF THE PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Embodiments of the present invention will be described below with reference to the drawings.

Figure 1:
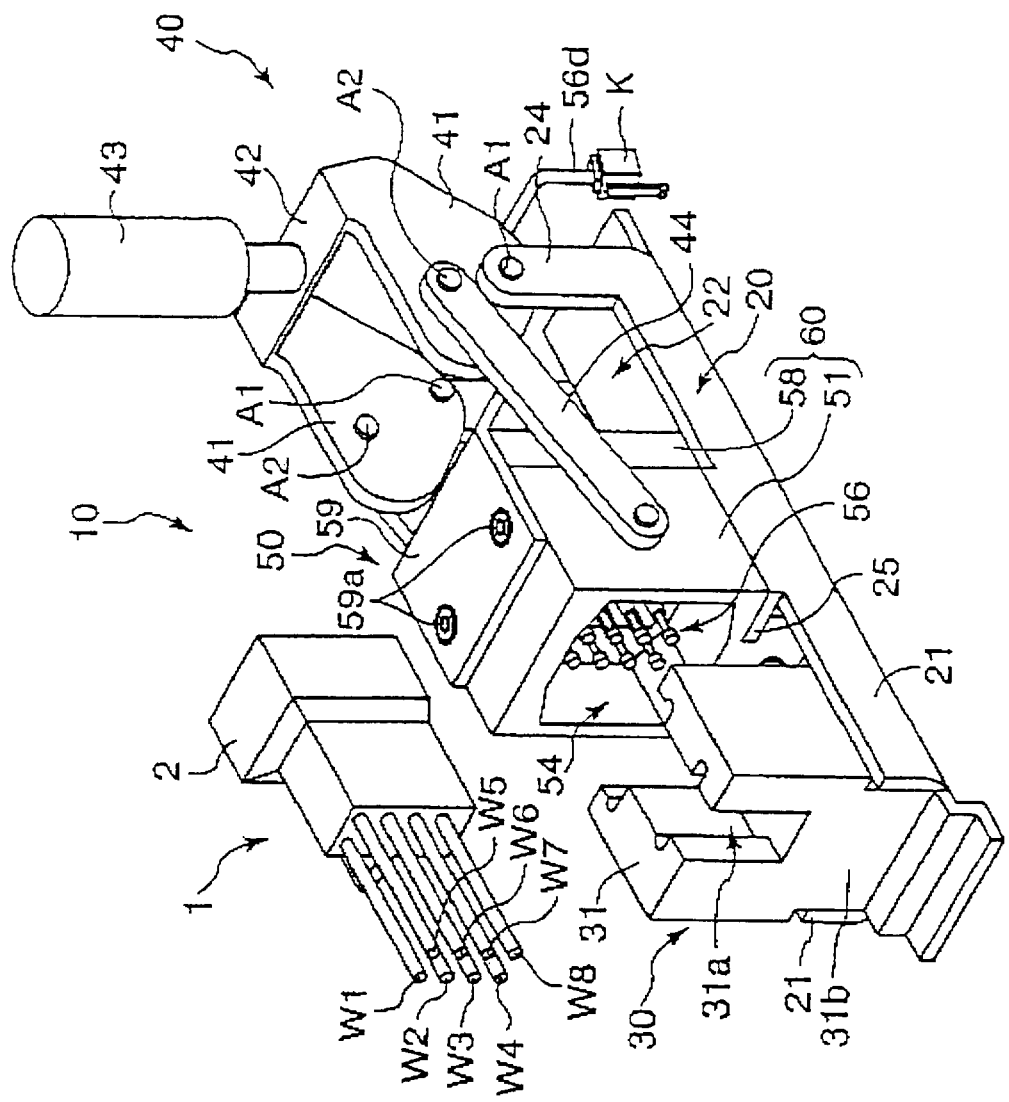
FIG. 1 is a perspective view of an embodiment of a continuity test unit in accordance with the present invention.

FIG. 1 is a perspective view of an embodiment of a continuity test unit 10 in accordance with the present invention.

As shown in FIG. 1, the continuity test unit 10 inspects a continuity of a connector 1 in which terminals 3 (see FIGS. 5A, 5B, 6A, and 6B) connected to ends of sheathed electric wires W1–W8 are secured in a housing 2. The connector 1 in the present embodiment has eight terminals 3 corresponding to the sheathed electric wires W1–W8. It is noted that the number of terminals and wires is merely exemplary, and that connectors containing any number of terminals could be used to practice the present invention. Proximal ends of the terminals 3 are fixed in the housing 2 so that distal ends of the terminals 3 are exposed at the end of the housing opposite to the sheathed electric wires W1–W8 (see FIGS. 5A and 5B). The continuity test unit 10 includes a base 20. The base 20 is substantially a rectangular plate member. The base 20 includes a pair of standing walls 21 extending up from the opposite lateral sides and a containing space 22 defined between the standing walls 21. The base 20 is provided on a longitudinal end with a connector holder 30 that holds the connector 1 and on the other longitudinal end with a driving mechanism 40. For convenience of explanation, the side where the connector holder 30 is mounted on the base 20 in the longitudinal direction is hereinafter referred to as a "front side" and the side where the standing walls 21 stand on the base 20 vertically in the thickness direction is hereinafter referred to as an "upper side".

Figure 2:
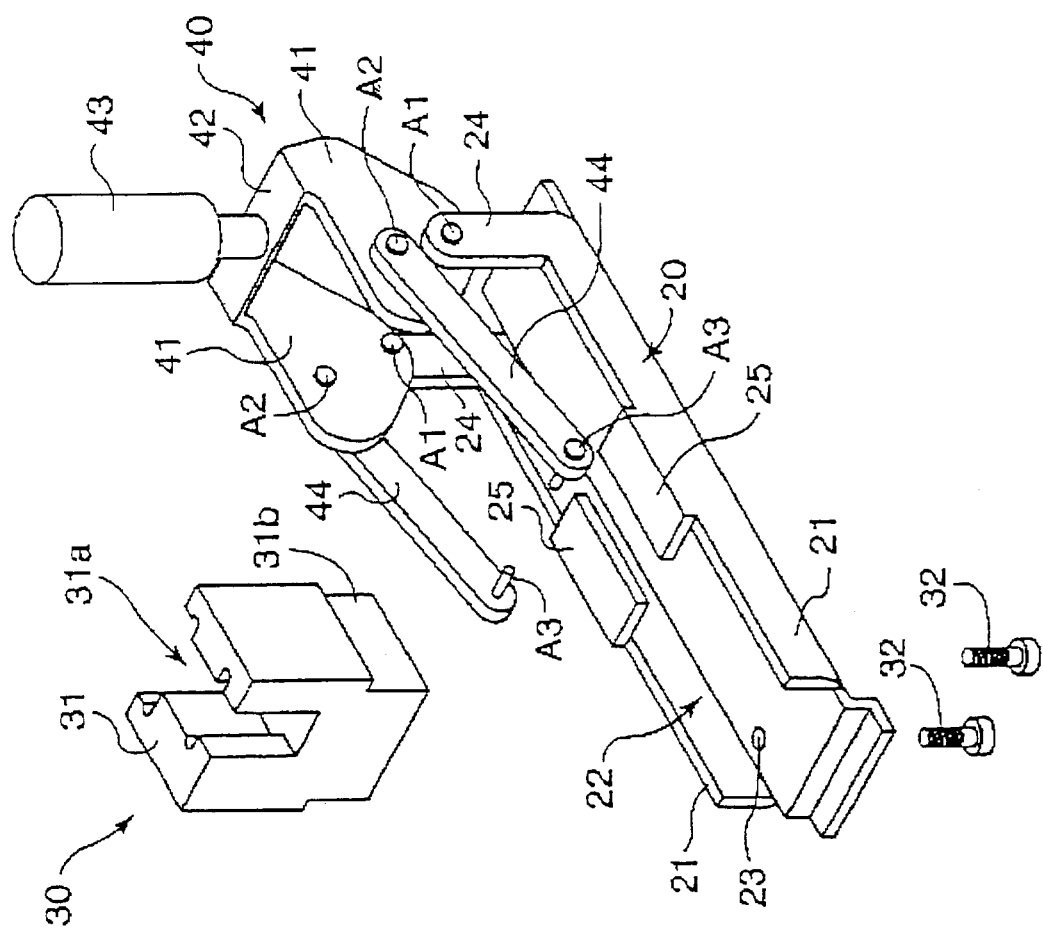
FIG. 2 is an exploded perspective view of a driving mechanism of the continuity test unit shown in FIG. 1.

FIG. 2 is an exploded perspective view of the driving mechanism 40 in the continuity test unit 10 shown in FIG. 1, illustrating a relationship between the driving mechanism 40 and the connector holder 30.

As shown in FIGS. 1 and 2, the connector holder 30 includes a holder body 31. The holder body 31 is a box-like configuration made of any suitable material, such as synthetic resin. The holder body 31 is provided with a chamber 31a for containing the housing 2 received through an upper opening so that probes 56 are aligned for coming into contact with the rear ends of the terminals 3. The holder body 31 is provided on a lower portion with a narrow bottom portion 31b configured to be received in the containing space 22 on the base 20. A pair of bolts 32 are screwed through a pair of threaded holes 23 (one of them shown in FIG. 2) in the base 20 into a pair of threaded holes (not shown) formed in the bottom wall of the narrow bottom portion 31b, thereby securing the holder body 31 to the base 20.

The base 20 includes a pair of supports 24 extending upward from the rear ends of the standing walls 21. A pair of handle plates 41 are respectively supported on a pair of axles A1 provided on supports 24. The axles A1 are transversely opposed to each other so that the axles A1 rotatably support the handle plates 41. A coupling plate 42 transverse to the standing walls 21 connects the ends of handle plates 41. A knob 43 is secured to a substantially middle portion of the coupling plate 42. The knob 43 stands upward in the vertical direction when the continuity test unit 10 is disposed at a release position described below. A pair of links 44 are supported on a pair of axles A2 fixed on the handle plates 41 near the axles A1. The axles A2 project inwardly to rotatably support the rearward ends of the respective links 44. Each link 44 is provided on the forward end with an axle A3 connected to a test section 50.

Figure 3:
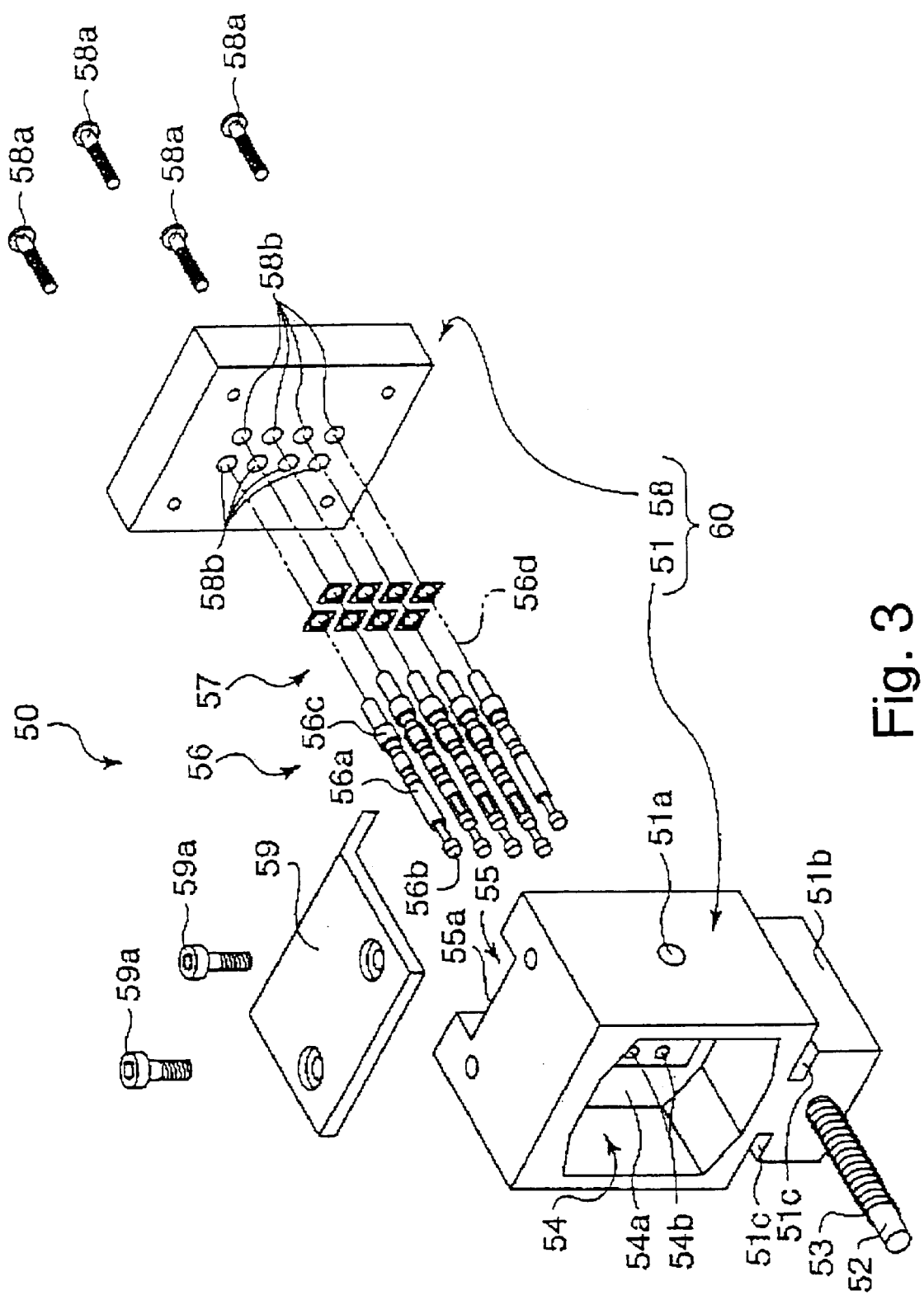
FIG. 3 is an exploded perspective view of a test section of the continuity test unit shown in FIG. 1.

FIG. 3 is an exploded perspective view of the test section 50 of the continuity test unit 10 shown in FIG. 1.

As shown in FIGS. 2 and 3, the respective opposed axles A3 extend inwardly toward each other so that they rotatably fit in bearing apertures 51a formed in opposite side walls of a block 51 of the test section 50 (only one aperture 51a shown in FIG. 3). The block 51 is a box-like configuration made of any suitable material, such as synthetic resin. The block 51 is provided on a lower part with a slide portion 51b and a pair of slide grooves 51c. The slide portion 51b is received in the containing space 22 on the base 20. The slide grooves 51c are provided in the opposite side walls of the block 51 and extend longitudinally. The slide grooves 51c slidably engage ribs 25 on the base 20. The ribs 25 project toward the containing space 22 from the top of the standing walls 21 and extend longitudinally within a sliding distance of the block 51. A rear end of a slide pin 52 is forcibly inserted into and fixed in a front part of the slide portion 51b. A compression coil spring 53 is mounted around the slide pin 52. A front end of the slide pin 52 is slidably inserted into the narrow portion 31b of the connector holder 30. When the front end of the slide pin 52 is inserted into the narrow portion 31b, the compression coil spring 53 is compressed between the connector holder 30 and the test section 50.

The block 51 includes an inlet port 54 that is open over substantially the entire front surface and a constraining groove 55 extending vertically in the rear surface of the block 51. The inlet port 54 is provided with an inner wall 54a having eight probe-passing holes 54b (only two holes shown in FIG. 3) configured to permit the probes 56 to pass. The probes 56 constitute a detector. It is noted that the number of probes and probe-passing holes is merely exemplary, and that a detector including any number probes sufficient to test the terminals in a connector housing could be used to practice the present invention. The eight probe-passing holes 54b are arranged at positions corresponding to the respective terminals 3 in the housing 2 of the connector 1 mounted in the connector holder 30. The probe-passing holes 54b extend through the inner wall 54a to a groove bottom wall 55a of the constraining groove 55. The groove bottom wall 55a serves as a constraining part in the present embodiment. Each probe 56 includes an outer sleeve 56a which is inserted into the probe-passing hole 54b from the rear thereof. The outer sleeve 56a is provided on a front end with a contact end portion 56b that can move forward and backward elastically in the front end of the outer sleeve 56a and can come into contact with the terminal 3 in the housing 2 of the connector 1. Each probe 56 is also provided at a position slightly forward from the rear end of the outer sleeve 56a with a latch sheath portion 56c coaxial with the outer sleeve 56a. The latch sheath portion 56c has an outer diameter slightly larger than the outer diameter of the outer sleeve 56a and the inner diameter of the probe-passing hole 54b. Furthermore, a predetermined load breakaway member 57 that serves as a coupling part is mounted on a rear end of each outer sleeve 56a adjacent to latch sheath portion 56c.

Figure 4:
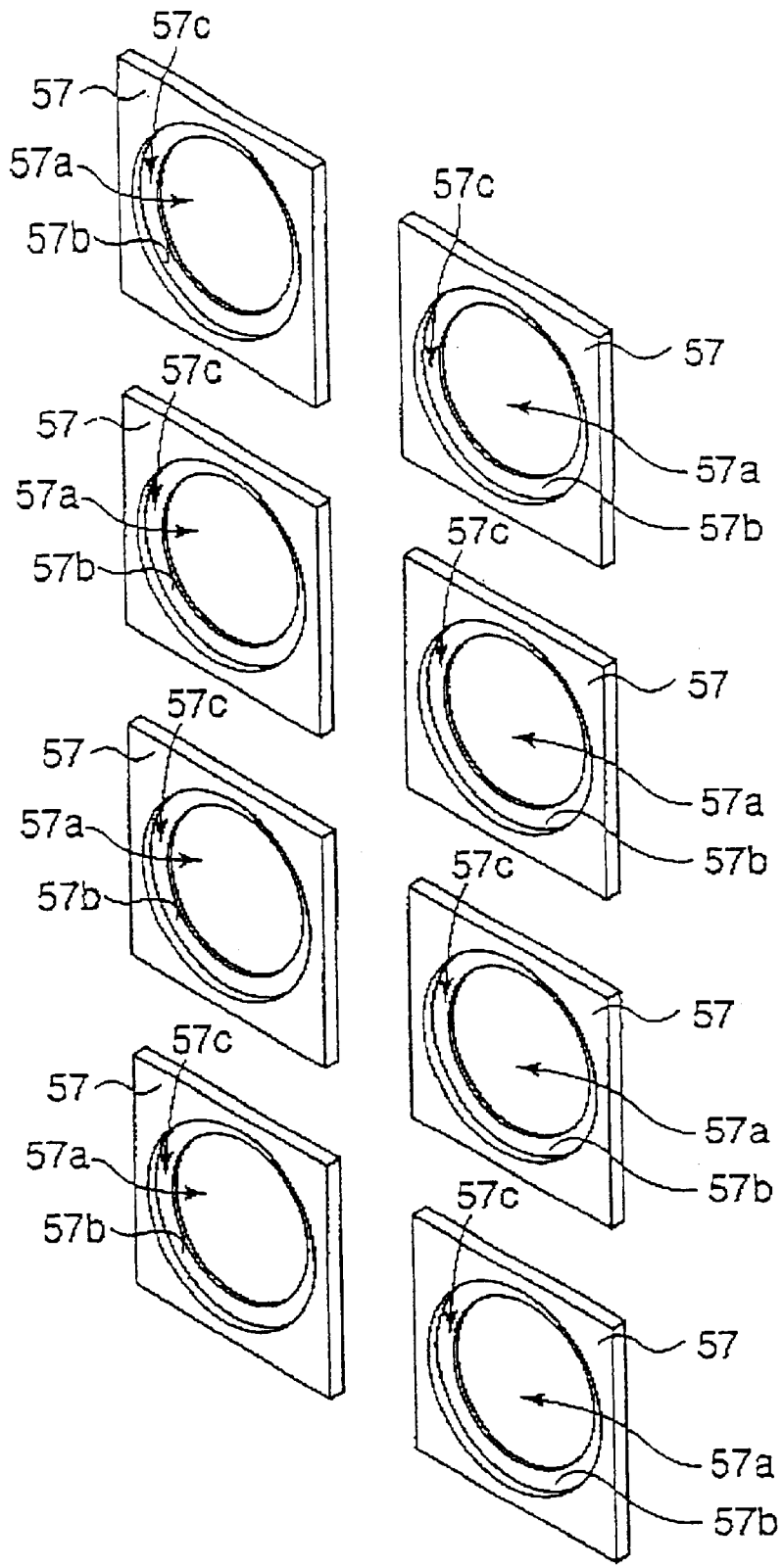
FIG. 4 is an enlarged perspective view of predetermined load breakaway members shown in FIG. 3.

FIG. 4 is an enlarged perspective view of predetermined load breakaway members 57 shown in FIG. 3.

As shown in FIGS. 3 and 4, eight predetermined load breakaway members 57 are provided in association with the probes 56 in the present embodiment. It is noted that the number of predetermined load breakaway members is merely exemplary, and that a test section including any number of breakaway members sufficient to accommodate the probes could be used to practice the present invention. Each breakaway member 57 is a substantially square sheet made of any suitable material, such as synthetic resin. Each breakaway member 57 is provided with a sleeve-passing opening 57a through which the outer sleeve 56a passes. The sleeve-passing opening 57a is provided with a containing recess 57c opening toward the front and a shoulder 57b around the recess 57c. That is, a thickness of the shoulder 57b is slightly less than a thickness of the remainder of the breakaway member 57. The thickness of the shoulder 57b is designed to be broken by a "predetermined load". The containing recess 57c has substantially the same inner diameter as that of the latch sheath portion 56c.

Figure 5A:
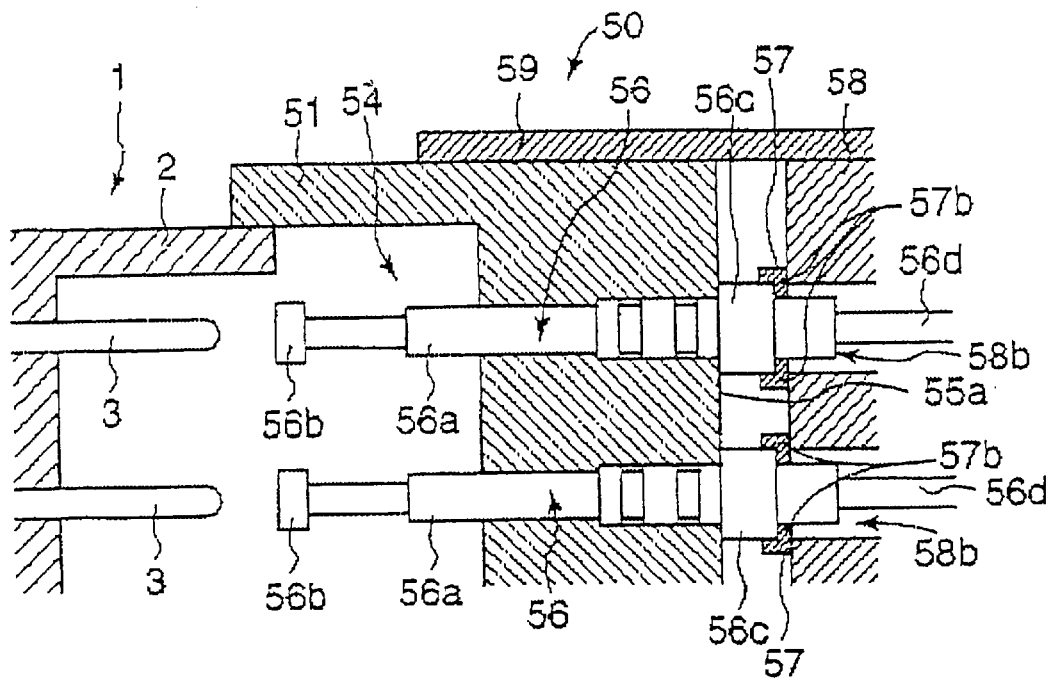
FIG. 5A is a side sectional elevation view of the continuity test unit shown in FIG. 1, illustrating the unit in a normal test condition immediately after the driving mechanism is turned.
Figure 5B:
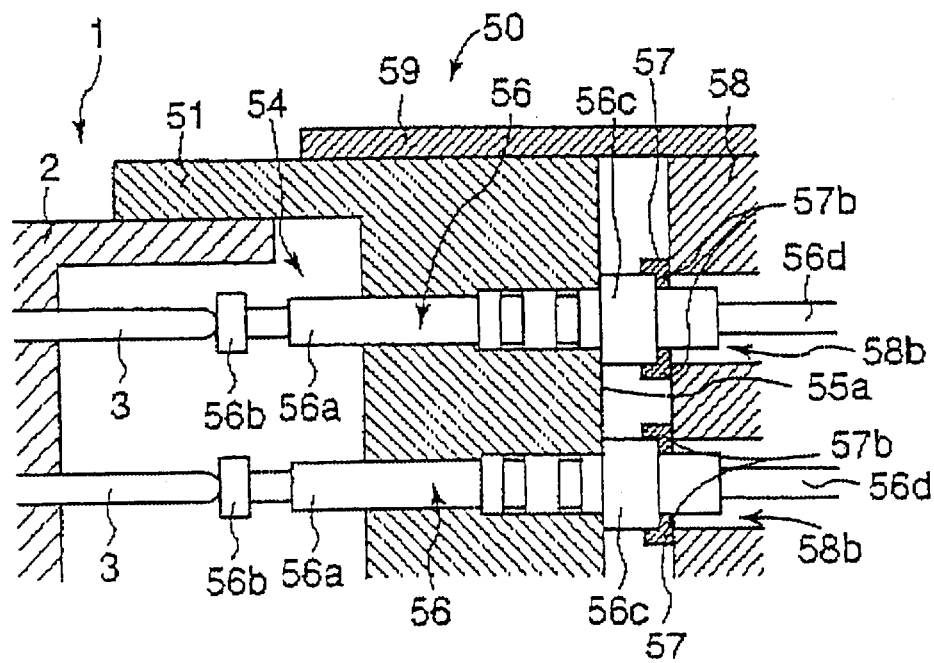
FIG. 5B is a side sectional elevation view of the continuity test unit shown in FIG. 1, illustrating the unit in a normal test position.

As shown in FIGS. 5A and 5B, a front end of each probe 56 is inserted into the probe-passing hole 54b from a rear side until the front end surface of the latch sheath portion 56c comes into contact with the groove bottom wall 55a.

The inserted contact end portion 56b of the probe 56 extends into the inlet port 54. The predetermined load breakaway member 57 is mounted on the rear end of the probe 56 until the rear end surface of the latch sheath portion 56c comes into contact with the shoulder 57b of the breakaway member 57. In this condition, a block cover 58 is secured to the block body 51 by bolts 58a to form a block 60. The block cover 58 is a rectangular solid plate made of any suitable material, such as synthetic resin. The block cover 58 is provided with eight support holes 58b at the positions corresponding to the probe-passing holes 54b. Each support hole 58b has an inner diameter that permits the latch sheath portion 56c to pass but does not permit the breakaway member 57 to pass in the thickness direction. The block cover 58 is secured to the block body 51 with the block cover 58 permitting the rear end of the probe 56 to pass and supporting the rear surface of the breakaway member 57 on the front surface. At this time, in order to transmit an output signal (i.e., contact information and switch information) from the contact end portion 56b, a cable 56d connected to the rear end of each probe 56 is inserted into the support hole 58b and connected to a connector K (see FIG. 1) at the rear side of the continuity test unit 10. The output signal is transmitted through the connection connector K to a well-known inspection apparatus. A constraining plate 59 is secured to the top of the block body 51 by a pair of bolts 59a so that the cable 56d drawn out from the rear side of the block cover 58 does not move upward to interfere with an operation of the driving mechanism 40.

In the continuity test unit 10 as described above, the test section 50 is driven forward by turning the driving mechanism 40.

FIGS. 5A and 5B are side sectional elevation views of the continuity test unit 10 shown in FIG. 1, illustrating the unit in a normal test condition. FIG. 5A shows the unit immediately after the driving mechanism 40 starts to turn and FIG. 5B shows the unit 10 in a test position.

As shown in FIG. 5A, the driven test section 50 receives the rear end of the housing 2 of the connector 1 mounted in the connector holder 30 into the inlet port 54. When the driving mechanism 40 is further turned, the respective contact end portions 56b of the respective probes 56 come into contact with the respective terminals 3.

As shown in FIG. 5B, when the driving mechanism 40 is still further turned, the contact end portions 56b that come into contact with the terminals 3 are elastically moved into the outer sleeve 56a. Switches of the probe 56 turn to ON in the condition shown in FIG. 5B, namely in the test position. The respective contact end portions 56b are electrically connected to the respective terminals 3. These signals (switch information and contact information) are transmitted to the well-known inspection apparatus, thereby commencing a continuity test. When the driving mechanism 40 is released, the test section 50 is moved away from the connector holder 30 to the release position due to a biasing force of the compression coil spring 53.

In the case where a terminal 3 is not normally fixed in the housing 2 of the connector 1, the contact end portion 56b may be abruptly spaced away from the terminal 3. The contact end portion 56b rebounds outwardly from the outer sleeve 56a and an elastic reaction force of the contact end portion 56b is applied to the breakaway member 57 so that the probe 56 tends to burst out forwardly. However, since the front end of the latch sheath portion 56c of the probe 56 is restrained from moving forward by the groove bottom wall 55a, the probe 56 does not burst out forwardly.

During the continuity test, an occasional abnormal condition or fault in a probe 56 will prevent relative movement between the contact end portion 56b and the outer sleeve 56a.

Figure 6A:
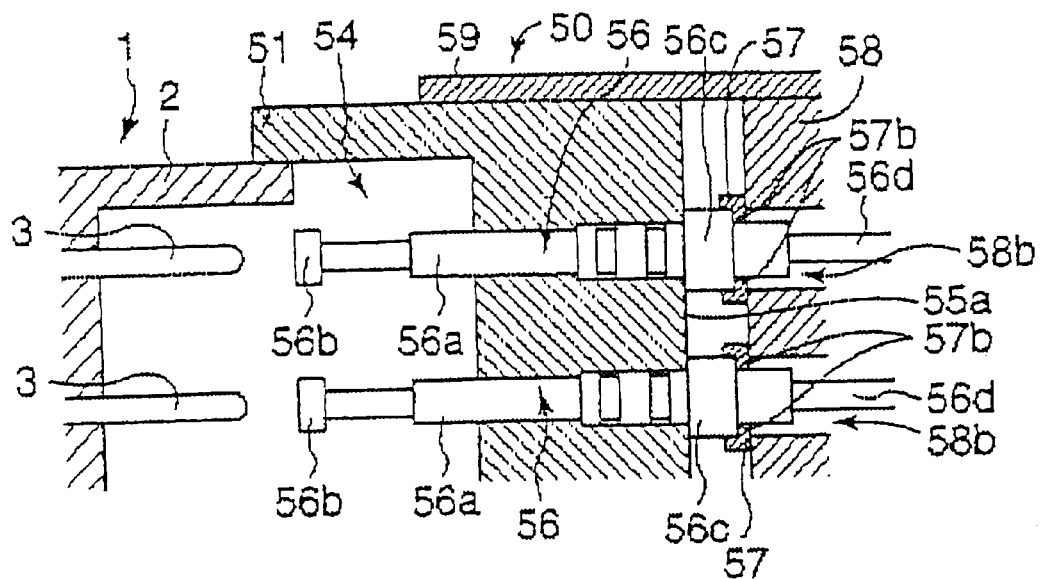
FIG. 6A is a side sectional elevation view of the continuity test unit shown in FIG. 1, illustrating the unit in a test condition in which probes are in an abnormal condition immediately after the driving mechanism is turned.
Figure 6B:
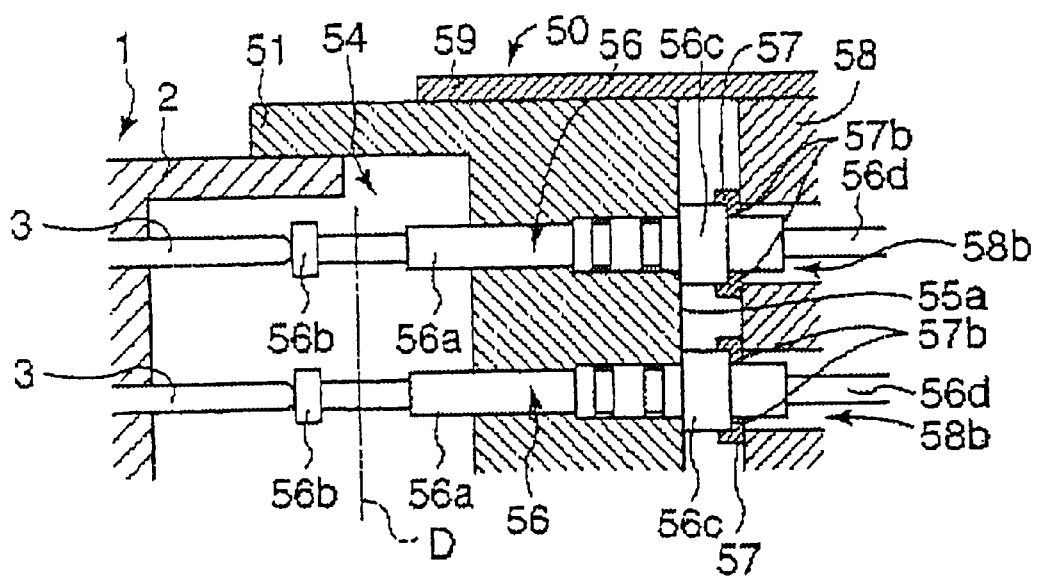
FIG. 6B is a side sectional elevation view of the continuity test unit shown in FIG. 1, illustrating the unit in a test condition in which probes are in an abnormal condition and contact end portions are coming into contact with terminals.
Figure 6C:
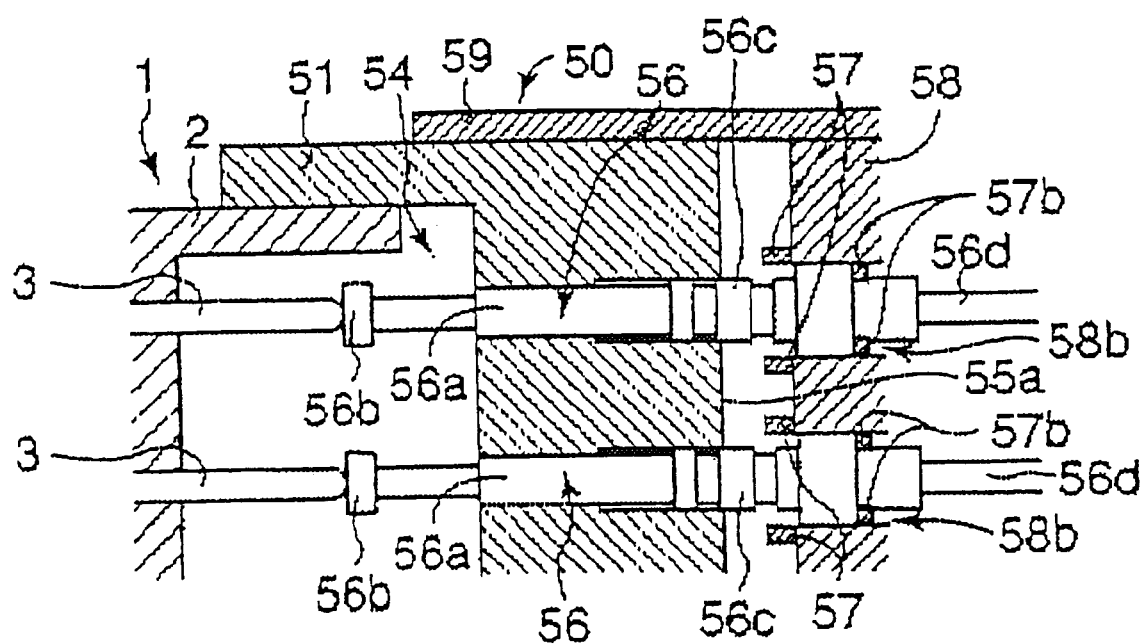
FIG. 6C is a side sectional elevation view of the continuity test unit shown in FIG. 1, illustrating the unit in a test condition in which probes are in an abnormal condition and the driving mechanism is turned to a position corresponding to the test position.

FIGS. 6A to 6C are side sectional elevation views of the continuity test unit 10 shown in FIG. 1, illustrating a test condition of the unit 10 in which the probes 56 are in an abnormal condition. FIG. 6A shows the unit 10 immediately after the driving mechanism 40 begins turning. FIG. 6B shows the contact end portions 56b coming into contact with terminals 3. FIG. 6C shows the condition when the driving mechanism 40 turned to a position corresponding to the test position.

As shown in FIG. 6A, when the driving mechanism 40 is turned, the test section 50 is driven forward so that the end part of the housing 2 of the connector I mounted in the connector holder 30 is received into the inlet port 54.

As shown in FIG. 6B, when the driving mechanism 40 is further turned, the contact end portions 56b of the probes 56 come into contact with the terminals 3. The driving mechanism 40 is further turned in order to introduce the terminals 3 to a regular test position D in the test section 50. However, the abnormal condition prevents relative movement between the contact end portion 56b and the outer sleeve 56a.

As shown in FIG. 6C, when the driving mechanism 40 is still further turned, the test section 50 is driven to the test position. Since the contact end portions 56b that have already come into contact with the terminals 3 cannot move into the outer sleeve 56a, an overload force will be applied to the probes 56. The overload force will be also applied to the shoulders 57b of the predetermined load breakaway members 57 that support the rear ends of the latch sheath portions 56c of the probes 56. Consequently, the probes 56 to which a load over a predetermined load is applied will break the shoulder 57b and enter the support holes 58b.

The test section 50 of the continuity test unit 10 described above is not limited to the above embodiment. For example, the test section 50 can be modified as follows.

Figure 7:
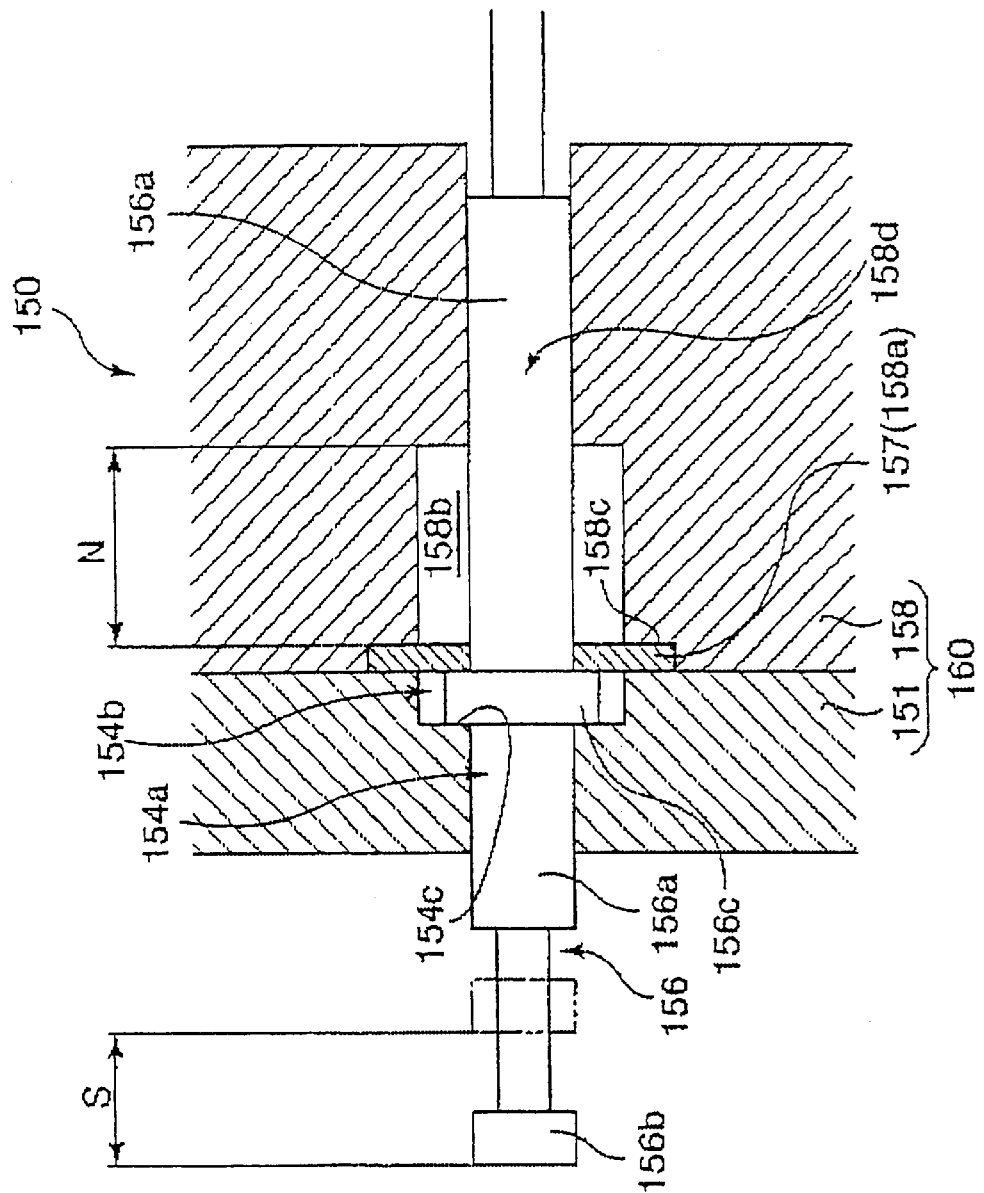
FIG. 7 is a side sectional elevation view of another embodiment of a portion of a test section in the continuity test unit in accordance with the present invention.

FIG. 7 is a side sectional elevation view of another embodiment of a part of a test section 150 in the continuity test unit 10 in accordance with the present invention.

As shown in FIG. 7, the test section 150 includes a block body 151. The block body 151 is provided with probe-passing holes 154a that permit outer sleeves 156a of probes 156 to pass. The block body 151 is also provided in a rear end wall with block shoulders 154c and guide holes 154b that are coaxial with the probe-passing holes 154a and receive latch sheath portions 156c of the probes 156. The probes 156 are inserted into the probe-passing holes 154a from the rear side until the front end surfaces of the latch sheath portions 156c come into contact with the block shoulders 154c. The outer sleeves 156a are inserted into predetermined load breakaway members 157 from the front side. The front end surfaces of the predetermined load breakaway members 157 support the rear end surfaces of the latch sheath portions 156c and the rear end surface of the block body 151. In this condition, a block cover 158 is fixed on a rear part of the block body 151 to form a block 160. The block cover 158 is provided in a front end wall with breakaway-receiving recesses 158a for containing the predetermined load breakaway members 157. The block cover 158 is provided with probe escape holes 158b and latch bottom surfaces 158c that are coaxial with the breakaway-receiving recesses 158a. That is, each predetermined load breakaway member 157 is clamped between the latch bottom surface 158c and the rear end surface of the block body 151. Each probe escape hole 158b has substantially the same inner diameter as that of the guide hole 154b. A depth N (longitudinal dimension) of each probe escape hole 158b is set to be more than an allowable displacement distance S of the contact end portion 156b of each probe 156 relative to each outer sleeve 156a. Furthermore, the block cover 158 is provided with antidropout holes 158d that extend to the rear end surface of the cover 158 coaxially with the probe escape holes 158b and have inner diameters that permit the outer sleeves 156a to pass but do not permit the latch sheath portion 156c to pass.

Since the test section 150 as described above has each block shoulder 154c as a constraining part, the probe 156 does not burst out forwardly when the probe 156 is rebounded as mentioned above.

The predetermined load breakaway members 157 that support the probes 156 are positioned at the rear position by the latch bottom surfaces 158c. It is possible in the present embodiment to precisely position the front and rear positions of the latch bottom surfaces 158c (i.e., depths of the breakaway-receiving recesses 158a) by cutting the block cover 158 from the front side.

Furthermore, when an overload force is applied to the probes 156 as described above, the predetermined load breakaway members 157 are broken, or ruptured, and the rear ends of the probes 156 are pushed into the antidropout holes 158d. At this time, since the probes 156 are pushed backward more than the allowable displacement distance S, the contact end portions 156b do not come into contact with the terminals 3 at the next test. That is, the probes 156, to which the overload force is applied, are released from coupling with the block 160 without coming out rearwardly from the block 160.

The predetermined load breakaway members 57 and 157 are not limited to the above embodiments. For example, a sheet of breakaway members may be used for a plurality of probes 56.

Figure 8:
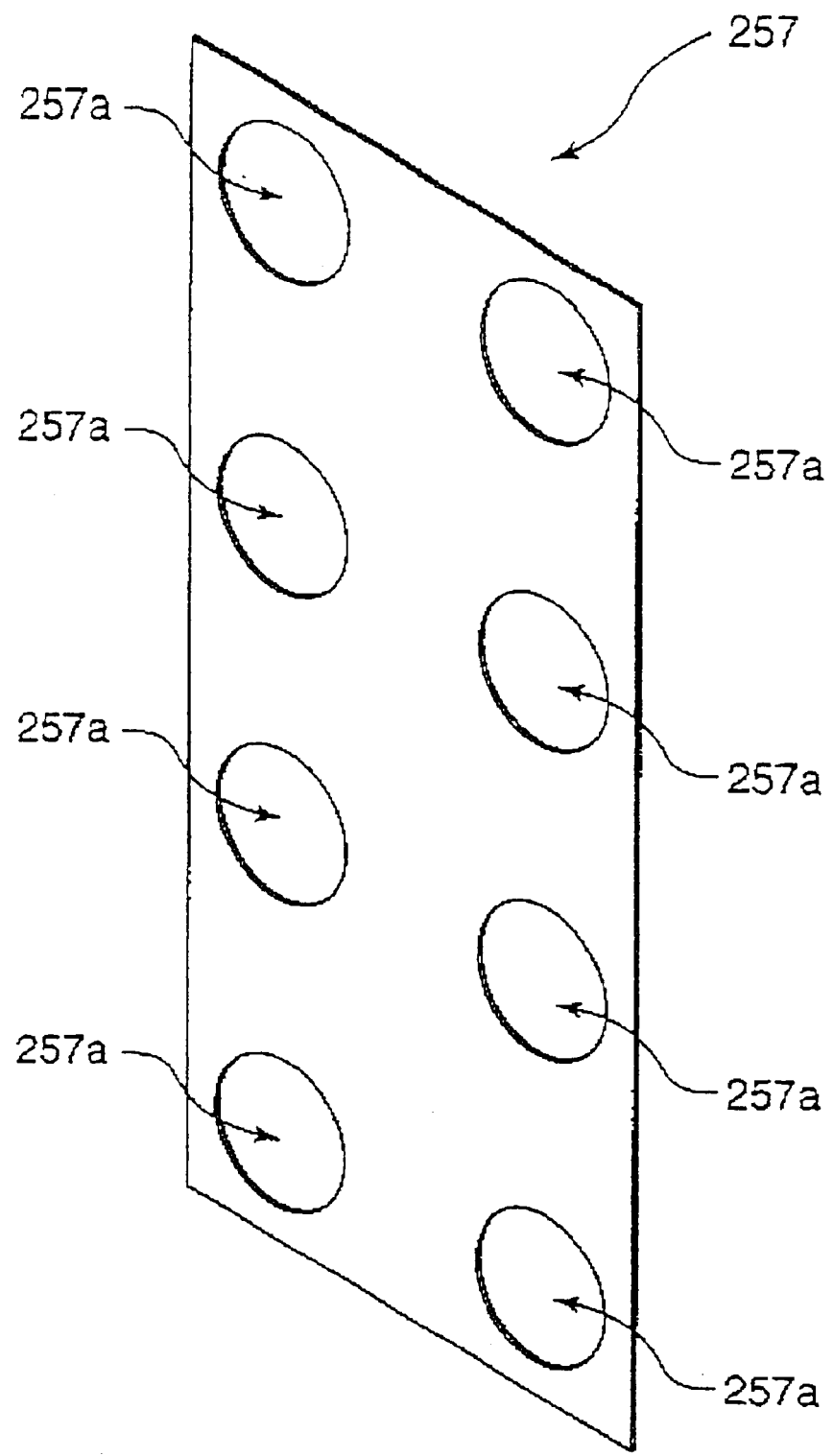
FIG. 8 is a perspective view of another embodiment of a predetermined load breakaway member in the continuity unit in accordance with the present invention.

FIG. 8 is a perspective view of another embodiment of a predetermined load breakway member 257 in the continuity unit in accordance with the present invention.

As shown in FIG. 8, a predetermined load breakaway member 257 is a sheet member made of any suitable material, such as synthetic resin. The breakaway member 257 is provided at positions corresponding to the respective probes 56 with eight sleeve-passing holes 257a having the same inner diameters as those of the sleeve-passing holes 57a mentioned above. That is, the predetermined load breakaway member 257 is formed by punching the respective sleeve-passing holes 257a out of a sheet having the same thickness as that of the shoulder 57b in the breakaway member 57. Accordingly, the respective sleeve-passing holes 257a are broken by the "predetermined load" mentioned above. Eight predetermined load breakaway members 57 are not required to be formed in a single sheet. Any desired number of predetermined load breakaway members may be formed from a single sheet.

A terminal to be tested may have a directional property. In order to carry out the continuity test for such a terminal, an angulated probe 256 may be used.

Figure 9:
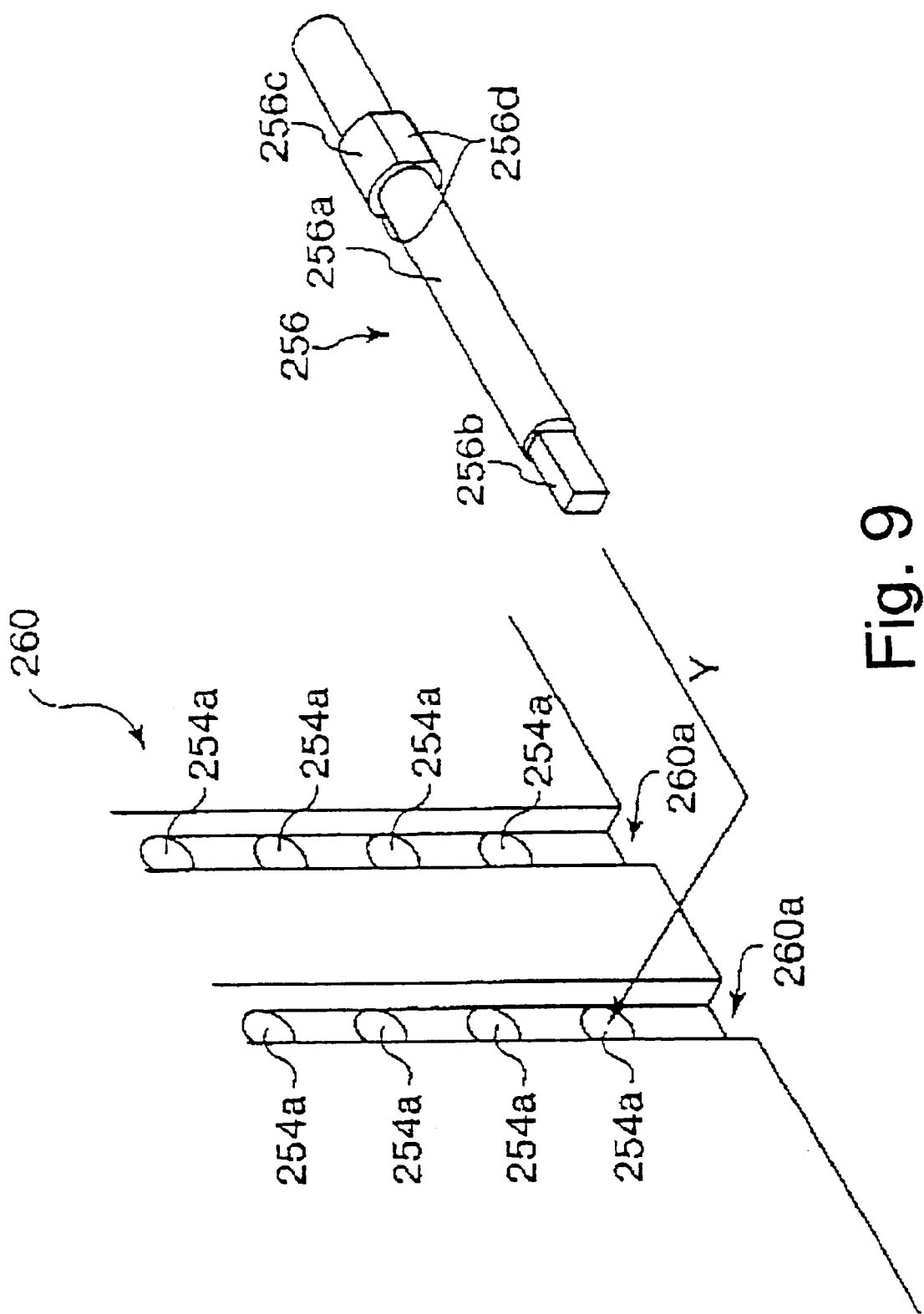
FIG. 9 is an exploded perspective view of another embodiment of an angulated probe and a block in the continuity test unit in accordance with the present invention.

FIG. 9 is a partially enlarged perspective view of another embodiment having an angulated probe 256 and a block 260 in the continuity test unit 10 in accordance with the present invention.

As shown in FIG. 9, the angulated probe 256 includes an outer sleeve 256a. An angulated contact end portion 256b is contained in an end of the outer sleeve 256a so that the portion 256b can move forward and backward elastically in the end. The angulated contact end portion 256b is formed into substantially a rectangular solid. The angulated probe 256 is provided near the other end of the outer sleeve 256a with a latch sheath portion 256c that is coaxial with the outer sleeve 256a and has an outer diameter lightly larger than that of the outer sleeve 256a. The latch sheath portion 256c is provided with a pair of chamfered surfaces 256d formed by cutting off a part of a circular section along the centerline in cross section. When the angulated probe 256 is inserted into each probe-passing hole 254a in a block body 260 along a direction shown by an arrow Y, the latch sheath portion 256c is inserted into each positioning groove 260a in the block body 260. The positioning groove 260a has the same width as a distance between the chamfered surfaces 256d and extends vertically. The groove 260a is open at the rear side. Consequently, the angulated probe 256 can be inserted into the block body 260 while the probe 256 is constrained from rotating. Since the other structures of the angulated probe 256 are the same as those of the continuity test unit 10 described above, an explanation of them is omitted here.

The continuity test unit 10 as described above has the predetermined load breakaway members 57. Therefore, when a load over the predetermined load is applied to the probes 56, the predetermined load breakaway members 57 are broken and damage to the terminals 3 and probes 56 can be prevented by releasing the probes 56 from the block 60. It is possible to carry out the continuity test again by exchanging the broken breakaway members 57 with new ones.

Since the probes 56 in the continuity test unit 10 are constrained from moving forward by the groove bottom surfaces 55a, the probes 56 do not burst out forward from the block 60.

In addition, since the predetermined load breakaway members 57 in the continuity test unit 10 are members independent from the block 60, it is possible to carry out the continuity test again by exchanging only the broken or ruptured breakaway members with new ones.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

The present disclosure relates to subject matter contained in priority Japanese Patent Application No. 2002-054328 filed on Feb. 28, 2002, which is herein expressly incorporated by reference in its entirety.

What is claimed:

1. A continuity test unit for a connector of a wire harness, the connector having a housing containing plural terminals, said continuity test unit comprising:
   a connector holder configured to hold a connector in position for testing the continuity of plural terminals contained in a housing of the connector;
   a test section configured to move forward toward and backward away from said connector holder, said test section including a detector opposed to the terminals contained in the housing of the connector held in said connector holder, and a block for supporting said detector; and a displacement device configured to move said test section relative to said connector holder between a test position in which said detector contacts the terminals and a release position in which said detector is spaced away from the terminals permitting loading and unloading of the connector from said connector holder;

wherein said detector includes an outer sleeve mounted to said block and a contact end portion contained in and extending from said outer sleeve for contacting the terminals, said contact end portion being movable relative to said outer sleeve forward toward said connector holder and backward away from said connector holder;

said test section further including a connecting member provided between said outer sleeve of said detector and said block, said connecting member interconnecting said detector and said block in such a manner that said detector is disconnected from said block when said detector is subjected to a predetermined load.

2. The continuity test unit for a connector according to claim 1, wherein said block has a constraining portion for constraining said outer sleeve of said detector from moving relative to said block toward said connector holder.

3. The continuity test unit for a connector according to claim 2, wherein said connecting member is removably assembled in said block of said test section.

4. The continuity test unit for a connector according to claim 1, wherein said connecting member is removably assembled in said block of said test section.

5. The continuity test unit for a connector according to claim 1, wherein said detector is subjected to the predetermined load as a result of an abnormal condition of said detector in which said contact end portion is prevented from moving relative to said outer sleeve.

6. The continuity test unit for a connector according to claim 1, wherein said detector is subjected to the predetermined load as a result of an abnormal positioning of the terminals contained in the housing of the connector held in said connection holder.

7. The continuity test unit for a connector according to claim 1, wherein said outer sleeve moves relative to said block away from said connector holder when said detector is subjected to the predetermined load.

8. The continuity test unit for a connector according to claim 1, wherein said test section comprises a plurality of said connecting members.

9. The continuity test unit for a connector according to claim 1, wherein said connecting member is a breakaway element which ruptures upon being subjected to the predetermined load by said detector.

10. The continuity test unit for a connector according to claim 9, wherein said outer sleeve moves relative to said block away from said connector holder when said breakaway element is subjected to the predetermined load and ruptures.

11. The continuity test unit for a connector according to claim 9, wherein said breakaway element includes an opening surrounded by a shoulder portion, said shoulder portion being thinner than a remaining portion of said breakaway element, such that said shoulder portion ruptures upon being subjected to the predetermined load by said detector.

12. The continuity test unit for a connector according to claim 9, wherein said test section comprises a plurality of said breakaway elements.

13. The continuity test unit for a connector according to claim 12, wherein said plurality of said breakaway elements are formed as a plurality of openings in a substantially flat sheet member having a thickness such that said sheet member ruptures upon being subjected to the predetermined load by said detector.

14. The continuity test unit for a connector according to claim 9, wherein said breakaway element constrains said outer sleeve from moving relative to said block away from said connector holder.

15. The continuity test unit for a connector according to claim 9, wherein said detector includes a latch sheath portion having a larger diameter than said outer sleeve, said breakaway element being configured to contact and constrain movement of said latch sheath portion.

16. The continuity test unit for a connector according to claim 15, wherein said block includes a first portion and a second portion defining a substantially enclosed space therebetween, said breakaway element and said latch sheath portion being located within said substantially enclosed space.

17. The continuity test unit for a connector according to claim 16, wherein said latch sheath portion contacts and is held in said substantially enclosed space by said first portion of said block, and said breakaway element contacts and is held in said substantially enclosed space by said second portion of said block.

18. A continuity test unit for a connector having a housing containing plural terminals, said continuity test unit comprising:

a connector holder configured to hold a connector in position for testing the continuity of plural terminals contained in a housing of the connector;

a test section configured to move forward toward and backward away from said connector holder, said test section including a detector opposed to the terminals contained in the housing of the connector held in said connector holder, and a block for supporting said detector; and a displacement device configured to move said test section relative to said connector holder between a test position in which said detector contacts the terminals and a release position in which said detector is spaced away from the terminals permitting loading and unloading of the connector from said connector holder;

said test section further including a breakaway element interconnecting said detector and said block for preventing said detector from moving relative to said block away from said connector holder, said breakaway element interconnecting said detector and said block in such a manner that said breakaway element ruptures and said detector is disconnected from said block when said detector is subjected to a predetermined load.

19. The continuity test unit for a connector according to claim 18, wherein said breakaway element includes an opening surrounded by a shoulder portion, said shoulder portion being thinner than a remaining portion of said breakaway element, such that said shoulder portion ruptures when said detector is subjected to the predetermined load.

20. The continuity test unit for a connector according to claim 18, wherein said test section comprises a plurality of said breakaway elements formed as a plurality of openings in a substantially flat sheet member having a thickness such that said sheet member ruptures when said detector is subjected to the predetermined load.

* * * * *